US008581580B2

(12) United States Patent  
Maida, Jr. et al.

(10) Patent No.: US 8,581,580 B2
(45) Date of Patent: Nov. 12, 2013

(54) DOWNHOLE ORIENTATION SENSING WITH NUCLEAR SPIN GYROSCOPE

(75) Inventors: John L. Maida, Jr., Houston, TX (US); Etienne Samson, Houston, TX (US); John Luscombe, Houston, TX (US); Paul Rodney, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 558 days.

(21) Appl. No.: 12/896,157

(22) Filed: Oct. 1, 2010

(65) Prior Publication Data

US 2011/0297372 A1 Dec. 8, 2011

Related U.S. Application Data

(63) Continuation-in-part of application No. 12/792,558, filed on Jun. 2, 2010, now Pat. No. 8,278,923.

(51) Int. Cl.
*G01V 3/00* (2006.01)

(52) U.S. Cl.
USPC .......................................... 324/303; 324/300

(58) Field of Classification Search
USPC .................. 324/300–322; 356/459, 369; 250/231.12; 166/255, 66
See application file for complete search history.

(56) References Cited

U.S. PATENT DOCUMENTS

| | | | |
|---|---|---|---|
| 4,456,891 A | 6/1984 | Fowks | |
| 4,706,388 A * | 11/1987 | Van Steenwyk | 33/304 |
| 4,833,787 A * | 5/1989 | Van Steenwyk | 33/302 |
| 6,648,083 B2 * | 11/2003 | Evans et al. | 175/41 |
| 7,114,580 B1 | 10/2006 | Balogh | |
| 7,798,216 B2 * | 9/2010 | Phillips et al. | 166/254.2 |
| 8,278,923 B2 * | 10/2012 | Samson et al. | 324/303 |
| 2007/0126594 A1 * | 6/2007 | Atkinson et al. | 340/853.1 |
| 2009/0079426 A1 | 3/2009 | Anderson | |
| 2013/0105224 A1 * | 5/2013 | Donderici et al. | 175/45 |

FOREIGN PATENT DOCUMENTS

| | | |
|---|---|---|
| WO | 0167142 A2 | 9/2001 |
| WO | 2009073736 A1 | 6/2009 |

OTHER PUBLICATIONS

International Search Report with Written Opinion issued Nov. 9, 2012 for PCT Patent Application No. PCT/GB2011/000833, 12 pages, pp. 145-158.

T.W. Kornack, et al.; "Nuclear Spin Gyroscope Based on an Atomic Comagnetometer", Physical Review Letters XP007917173, dated Dec. 2, 2005, 4 pages, pp. 137-141.

Kornack, T.W. and Romalis, M.V.; Dynamics of Two Overlapping Spin Ensembles Interacting by Spin Exchange; 253002-1 to -4, vol. 89, No. 25; The American Physical Society; Dec. 16, 2002; 4 pages; Princeton, New Jersey.

Halliburton; Evader MWD Gyro Service; Article H03876; Dec. 2006; 2 pages.

(Continued)

*Primary Examiner* — Brij Shrivastav
(74) *Attorney, Agent, or Firm* — Smith IP Services, P.C.

(57) ABSTRACT

Downhole orientation sensing with a nuclear spin gyroscope. A method of sensing orientation of an instrument assembly in a subterranean well can include incorporating an atomic comagnetometer and an optical source into the instrument assembly, and installing the instrument assembly in the well. A downhole orientation sensing system for use in conjunction with a subterranean well can include a downhole instrument assembly positioned in the well, the instrument assembly including an atomic comagnetometer and an optical source which transmits light to the atomic comagnetometer.

50 Claims, 7 Drawing Sheets

(56) References Cited

OTHER PUBLICATIONS

Kornack, T.W., Ghosh R.K. and Romalis, M.V.; Nuclear-Spin Gyroscope Based on an Atomic Co-Magnetometer; Technical Support Package for LEW-17942-1; Nasa Tech Briefs; Jan. 1, 2008; 6 pages; Cleveland, Ohio.

Kominis, I.K., Kornack, T.W., Allred J.C. and Romalis, M.V.; A Subfemtotesla Multichannel Atomic Magnetometer; Article of vol. 422 pp. 596-599; Nature; Apr. 10, 2003; 2 pages; Princeton, New Jersey.

Torkildsen, T., Havardstein, S.T., Weston, J. L. and Ekseth, R.; Prediction of Wellbore Position Accuracy When Surveyed With Gyroscopic Tools; SPE 90408; Society of Petroleum Engineers; Sep. 26-29, 2004; 21 pages; Houston, Texas.

Torkildsen T., Havardstein S.T., Weston J. and Ekseth R.; Prediction of Wellbore Position Accuracy When Surveyed With Gyroscopic Tools; [Revised for publication in] SPE Drilling & Completion Magazine, [Peer reviewed article]; Mar. 2008; 8 pages; Houston, Texas.

Broptics Technology Inc.; Pump Laser Stabilizer, web archive, dated 2004, 2 pages.

Wikipedia; Condenser (microscope), web archive, dated Jun. 17, 2010, 3 pages.

Perschbacher, T. A.; Hostutler, D. A.; Shay, T. M.; High-Efficiency Diode-Pumped Rubidium Laser: Experimental Results (Preprint), Conference Paper, dated Jan. 29, 2007, 8 pages.

Broptics Technology Inc.; FBG and Applications: The Filter that Breaks Grading, Power Point Presentation, undated, 16 pages.

Frankfurt Laser Company; Laser Diode FIDL-10S-780-DL14-FBG, Specification, undated, 2 pages.

Volodin, B. L.; Dolgy, S. V.; Melnik, E. D.; Downs, E.; Shaw, J.; and Ban, V. S.; Wavelength Stabilization and Spectrum Narrowing of High-Power Multimode Laser Diodes and Arrays by Use of Volume Bragg Gratings, Optics Letters, vol. 29 No. 16, dated Aug. 15, 2004, 3 pages.

Wikipedia, "Helium-neon laser", online encyclopedia, dated Jun. 30, 2010, 3 pages, pp. 7-10.

Jimenez, Juan J., and Petersen, F. Russell, "Recent Progress in Laser Frequency Synthesis", Infrared Physics vol. 17, pp. 541-546, dated 1977, 6 pages.

Piezo Technologies, "New Material Advances Extreme High-Temp Applications", brochure, undated, 1 page.

V. B. Gerard, "IOP Science, Journal of Scientific Instruments", vol. 39, No. 5 abstract, dated May 5, 1962, 3 pages.

Callahan, Glen P.; Kubacki, Emily; and Abbot, Lynore; "Line-Narrowing Etalons", Technical Reference, document No. 20050422, undated, 4 pages, 2007 pp. 223-230.

Guy, Martin; "High Performance Fiber Bragg Grating Components for Next generation DWDM Networks", Teraxion Optical Components Forum, dated Sep. 11, 2001, 45 pages, pp. 206-251.

Unauthored; "Optical Pumping of Rubidium Vapor", undated, 8 pages, 2001, pp. 142-150.

Osram; "Rubidium Vapor Spectral Line Source", technical data sheet, undated, 1 page, 2007, pp. 21.

Wikipedia; "Population Inversion", online encyclopedia, dated Aug. 3, 2010, 7 pages, pp. 323-330.

Azmoun, Bob and Metz, Susan; "Recipe for Locking an Extended Cavity Diode Laser From the Ground Up", abstract web archive, undated, 59 pages, pp. 160-219.

Harvard; "Calculated Fluorescence Spectrum from Natural Abundance Rubidium", web article, undated, 1 page, 2005, pp. 110.

Guy, Martin and Trepanier, Francois; "State-of-the-Art Manufacturing Techniques Push Fiber Bragg Gratings Components to New Levels of Performance", published in Photonics Spectra, dated Mar. 2002, 5 pages, pp. 124-129.

Piezotech, LLC.; "Ultra High-Temperature Piezoelectric Ceramic with Extreme Piezoelectric Stability", web archive, dated Jun. 4, 2004, 1 page, pp. 113.

Wikipedia; "Wave Plate", online encyclopedia, dated Jun. 11, 2010, 2 pages, pp. 228-230.

\* cited by examiner

DOWNHOLE ORIENTATION SENSING WITH NUCLEAR SPIN GYROSCOPE

CROSS-REFERENCE TO RELATED APPLICATION

The present application is a continuation-in-part of prior application Ser. No. 12/792,558, filed on 2 Jun. 2010, the entire disclosure of which is incorporated herein by this reference.

BACKGROUND

This disclosure relates generally to equipment utilized and operations performed in conjunction with a subterranean well and, in an example described below, more particularly provides for downhole orientation sensing with a nuclear spin gyroscope.

It is frequently desirable to be able to sense the orientation of well tools, instruments, etc. in a well. For example, in some logging operations, sensitive tiltmeters and microseismic sensors are used. The orientation of these sensors in a well needs to be known, in order to relate sensed parameters to their positions in space relative to the well.

Various mechanical and optical gyroscopes, gyrocompasses, etc. are known in the art, but each of these suffers from one or more deficiencies. These deficiencies can include mechanical complexity, the use of rapidly spinning components which can interfere with sensitive tiltmeters and microseismic instruments, lack of ability to find a true north direction on its own, large dimensions, low acceptable operating temperature, inability to operate effectively in a ferrous casing, etc.

Therefore, it will be appreciated that improvements are needed in the art of downhole orientation sensing. These improvements would be useful in logging and other operations in which the orientation of downhole instruments, well tools, etc. is desired.

SUMMARY

In the disclosure below, systems and methods are provided which bring improvements to the art of downhole orientation sensing. One example is described below in which a nuclear spin gyroscope is used for downhole orientation sensing. Another example is described below in which a downhole atomic comagnetometer is optically pumped and interrogated from a remote location. Yet another example is described below in which a downhole atomic comagnetometer is optically pumped and interrogated downhole.

In one aspect, the disclosure below provides to the art a method of sensing orientation of an instrument assembly in a subterranean well. The method can comprise incorporating an atomic comagnetometer and an optical source into the instrument assembly, and installing the instrument assembly in the well.

In another aspect, a downhole orientation sensing system for use in conjunction with a subterranean well is provided by this disclosure. The sensing system can comprise a downhole instrument assembly positioned in the well. The instrument assembly includes an atomic comagnetometer.

One or more optical waveguides may transmit light between the atomic comagnetometer and a remote location. Alternatively, an optical source can be included in the downhole instrument assembly.

These and other features, advantages and benefits will become apparent to one of ordinary skill in the art upon careful consideration of the detailed description of representative examples below and the accompanying drawings, in which similar elements are indicated in the various figures using the same reference numbers.

DETAILED DESCRIPTION

Figure 1:
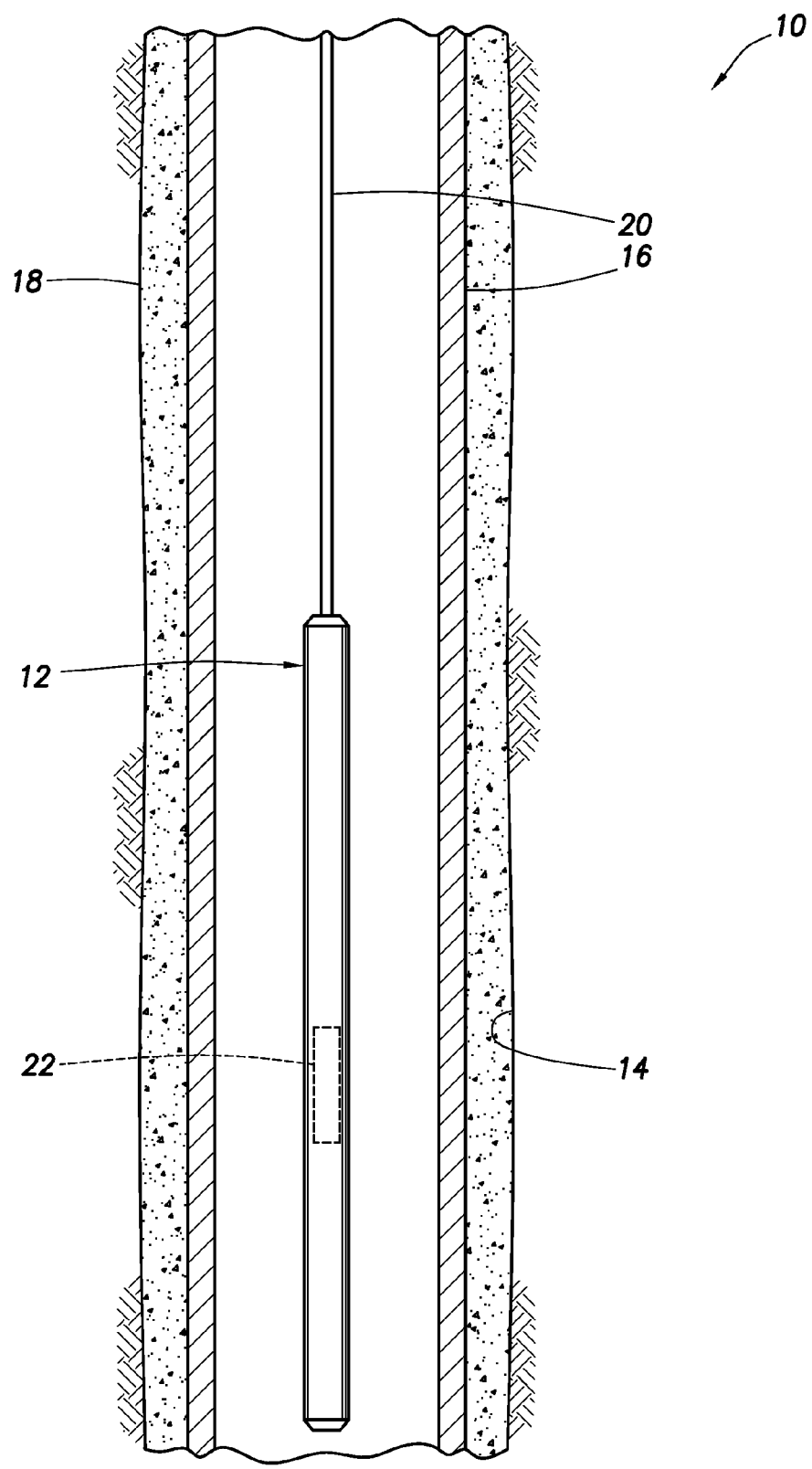
FIG. 1 is a schematic partially cross-sectional view of a downhole orientation sensing system which can embody principles of the present disclosure.

Representatively illustrated in FIG. 1 is a downhole orientation sensing system 10 and associated method which can embody principles of this disclosure. As depicted in FIG. 1, a well logging operation is being performed, in which an instrument assembly 12 is conveyed into a wellbore 14 lined with casing 16 and cement 18. In other examples, the wellbore 14 may not be lined with casing 16 or cement 18.

The instrument assembly 12 may include any number or combination of instruments (such as, microseismic sensors, tiltmeters, etc.). The instruments may include logging instruments and/or instruments not typically referred to as "logging" instruments by those skilled in the art. The instrument assembly 12 may also include other types of well tools, components, etc.

In the example of FIG. 1, the instrument assembly 12 is conveyed through the wellbore 14 on a cable 20. The cable 20 may be of the type known to those skilled in the art as a wireline, logging cable, etc. The cable 20 may include any number, type and combination of lines (such as electrical, hydraulic and optical lines, etc.).

Note that the cable 20 is only one possible means of conveying the instrument assembly 12 through the wellbore 14. In other examples, a tubular string (such as a production tubing, coiled tubing or drill string, etc.), self-propulsion or other means may be used for conveying the instrument assembly 12. The cable 20 could be incorporated into a sidewall of the tubular string, or the cable could be internal or external to the tubular string. In further examples, the instrument assembly 12 could be incorporated into another well tool assembly, which is conveyed by other means.

One use of the instrument assembly 12 could be in conjunction with measurement while drilling (MWD) sensors of the type which sense various parameters as the wellbore 14 is being drilled. The instrument assembly 12, or any portion of it, could be incorporated into an MWD sensor assembly, or the instrument assembly could be separate from the MWD sensor assembly.

Thus, it should be clearly understood that the sensing system 10 as representatively depicted in FIG. 1 is only one of a wide variety of possible implementations of the principles described in this disclosure. Those principles are not limited at all to any of the details of the sensing system 10 as described herein and illustrated in the drawings.

In one unique feature of the sensing system 10, the instrument assembly 12 includes at least one atomic comagnetometer 22 for sensing a downhole orientation of the instrument assembly. The atomic comagnetometer 22 is sensitive to a rate of mechanical rotation about a particular axis and, in combination with other components described more fully below, is part of a nuclear spin gyroscope.

Figure 2:
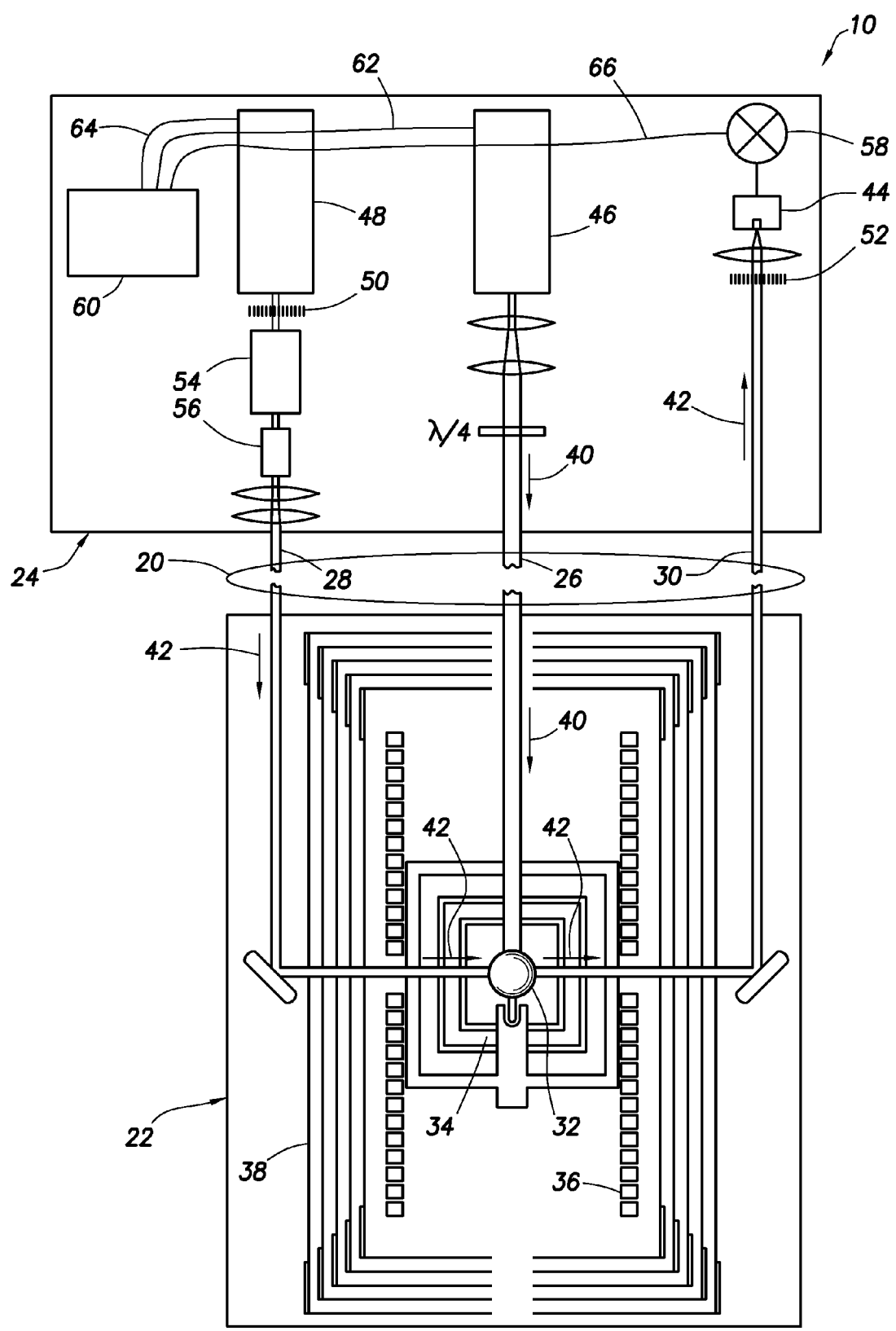
FIG. 2 is an enlarged scale schematic view of a control system and atomic comagnetometer which may be used in the sensing system of FIG. 1.

Referring additionally now to FIG. 2, an enlarged scale schematic view of the atomic comagnetometer 22 and a control system 24 is representatively illustrated, apart from the remainder of the sensing system 10. In this view, it may be seen that the control system 24 is preferably remotely positioned relative to the comagnetometer 22.

The control system 24 could be positioned at a surface location, a subsea location, a rig location, or at any other remote location. In other examples (such as those depicted in FIGS. 4-12), all or any part of the control system 24 may be conveyed downhole with, or included in, the instrument assembly 12.

In the example of FIG. 2, the control system 24 is connected to the comagnetometer 22 via the cable 20. The cable 20 includes optical waveguides 26, 28, 30 (such as optical fibers, optical ribbons, etc.) for transmitting light between the control system 24 and the comagnetometer 22.

As depicted in FIG. 2, the comagnetometer 22 includes a cell 32, a hot air chamber 34 surrounding the cell, field coils 36 and magnetic shields 38 enclosing the other components. The cell 32 is preferably a spherical glass container with an alkali metal vapor, a noble gas and nitrogen therein.

In one example, the alkali metal may comprise potassium or rubidium, and the noble gas may comprise helium or neon. However, other alkali metals and noble gases may be used in keeping with principles of this disclosure.

A pump beam 40 transmitted by the optical waveguide 26 enters the cell 30 and polarizes the alkali metal atoms. The polarization is transferred to the noble gas nuclei by spin-exchange collisions.

A probe beam 42 transmitted to the cell 32 by the optical waveguide 28 passes through the cell perpendicular to the pump beam 40. The probe beam 42 is transmitted from the cell 32 to a photodetector 44 by the optical waveguide 30.

Analysis of the probe beam 42 characteristics provides an indication of the direction of the alkali metal polarization (and, thus, the strongly coupled nuclear polarization of the noble gas). The relationships among the electron polarization of the alkali metal atoms, the nuclear polarization of the noble gas atoms, the magnetic fields, and the mechanical rotation of the comagnetometer 22 are described by a system of coupled Bloch equations. The equations have been solved to obtain an equation for a compensating magnetic field (automatically generated in the comagnetometer, and which exactly cancels other magnetic fields), and a gyroscope output signal that is proportional to the rate of mechanical rotation about an axis and independent of magnetic fields.

A similar atomic comagnetometer, and its use in a nuclear spin gyroscope, are described by T. W. Kornack, et al., "Nuclear spin gyroscope based on an atomic co-magnetometer," NASA Tech Briefs LEW-17942-1 (Jan. 1, 2008). Since the details of the comagnetometer 22 and its operation are well known to those skilled in the art, it will not be described further herein.

As described above, the comagnetometer 22 is incorporated in an instrument assembly 12 which is positioned in a well. At a location remote from the comagnetometer 22, the control system 24 includes a pump laser 46 which generates the pump beam 40. Another probe laser 48 generates the probe beam 42.

Other components which may comprise the control system 24 include polarizers 50, 52, a Faraday modulator 54, a Pockel cell 56, a lock-in amplifier 58 and electronic circuitry 60 (such as, a power supply, analog circuit components, one or more electronic processors, telemetry circuit components, memory, software for controlling operation of the lasers 46, 48, software for receiving and analyzing the output of the amplifier 58, etc.). The electronic circuitry 60 may be connected to the lasers 46, 48 and amplifier 58 via lines 62, 64, 66.

Note that it is not necessary for all of the components depicted in FIG. 2 to be included in the control system 24, and other components could be provided, in keeping with the principles of this disclosure. For example, the photodetector 44, polarizer 52 and amplifier 58 could be positioned downhole (e.g., as part of the instrument assembly 12, etc.), in which case the cable 20 may not include the optical waveguide 30, but instead could include the line 66 (i.e., extending from the downhole instrument assembly 12 to the control system 24).

In another example, the probe laser 48 and associated polarizer 50, Faraday modulator 54 and Pockel cell 56 could be positioned downhole. Preferably, at least the pump laser 46 is included in the control system 24 at the remote location, since it is desirably a high power diode laser, which may be difficult to maintain within an acceptable operating temperature range in a relatively high temperature downhole environment, although a cooler (such as a thermo-electric cooler) could be used to cool the pump laser and/or the probe laser 48 downhole, if desired. A suitable downhole cooler is described in U.S. Pat. No. 6,769,487, and another is described in International application serial no. PCT/US09/69450.

The pump laser 46 preferably generates the pump beam 40 at wavelengths of 770 nm and 770.5 nm, or 794.98 nm and 795.28 nm, for respective potassium and rubidium alkali metals. However, the attenuation of optical power in an optical waveguide is highly dependent on the wavelength of the incident optical source. In the 770 nm to 800 nm range, the Rayleigh scattering loss in an optical fiber is relatively high.

To compensate for Rayleigh scattering loss over perhaps multiple kilometers of the waveguide 26, the pump laser 46 is preferably a relatively high power diode laser. However, with more powerful lasers, it is desirable to design around additional linear scattering effects due to high optical power densities including, for example, elastic and inelastic types (e.g., Raman and Brillouin), and non-linear scattering effects (via parametric conversion).

In particular, Raman and Brillouin scattering effects are due to the "glass-light" (material-electromagnetic field) interaction and become significant at about 100 mW in singlemode optical fiber. Certain multimode optical fibers with larger core diameters and higher solid angle acceptance cones (higher numerical aperture) allow for reduction in optical power density, in order to operate below Raman and Brillouin scattering power density thresholds.

In one example, a reduced scattering step index optical fiber may be used for the waveguide 26. Step index fibers use pure silica (or low doping concentrations) for the core material.

Such step index fibers are less lossy as compared with parabolically doped graded index "higher bandwidth" fiber which typically uses germanium to increase the refractive index of the core. Germanium is an impurity in the glass and will amplify backscatter effects.

Because a greater portion of the optical signal will be reflected back along a graded index fiber, the optical power transmitted and, thus, the optical power available at the downhole end of the fiber will be reduced. A fiber with less attenuation will permit use of a lower power optical source.

In another example, a double frequency optical source may be used, and second harmonic generation (frequency doubling) may be performed at the downhole instrument assembly 12. Attenuation in an optical fiber is relatively low in the range of 1540 nm to 1600 nm.

Second harmonic generation is a nonlinear optical process, in which photons interacting with a nonlinear material are effectively "combined" to form new photons with twice the energy and, therefore, twice the frequency and half the wavelength of the initial photons. It is a special utilization of sum frequency generation.

By using an optical source wavelength which is twice that needed, and performing optical frequency doubling at the downhole instrument assembly 12, optical signal loss over a long transmission length can be substantially reduced. This will permit use of lower power optical sources.

Thus, some options for generating the beams 40, 42 include: 1) transmission of ~1590 nm light from a remote location via a single mode fiber, with second harmonic generation of ~795 nm light in the instrument assembly 12, 2) transmission of ~795 nm light via multimode fiber, and 3) generation of one or both of the beams in the instrument assembly.

In one example, the beams 40, 42 are transmitted from lasers 46, 48 located at the surface to the downhole comagnetometer 22, and the beam 42 is transmitted back to the surface for detection by the photodetector 44. Active (electrically dissipative) electronics are minimized or eliminated downhole.

Optical sources other than lasers 46, 48 may be used, if desired. Some options for optical sources include vapor lamps, optical power amplifiers, and any other sources of light at the alkali metal D lines.

The optical waveguides 26, 28, 30 extending between the surface and the downhole comagnetometer 22 may be optical fibers, whether singlemode, multimode, dual-mode or a combination thereof. Thus, the cell 32 can be both pumped and interrogated from a remote location.

Benefits which may be obtained from these configurations (as compared to prior mechanical and fiber optic gyroscopes, gyrocompasses, etc.) include: 1) small dimensioned downhole component package (e.g., less than 5 cm diameter), 2) downhole operating temperature of at least 150 degrees C., 3) minimized moving parts downhole (which could otherwise interfere with tiltmeter and microseismic sensors), and 4) the comagnetometer 22 can automatically orient relative to a true north direction.

Figure 3:
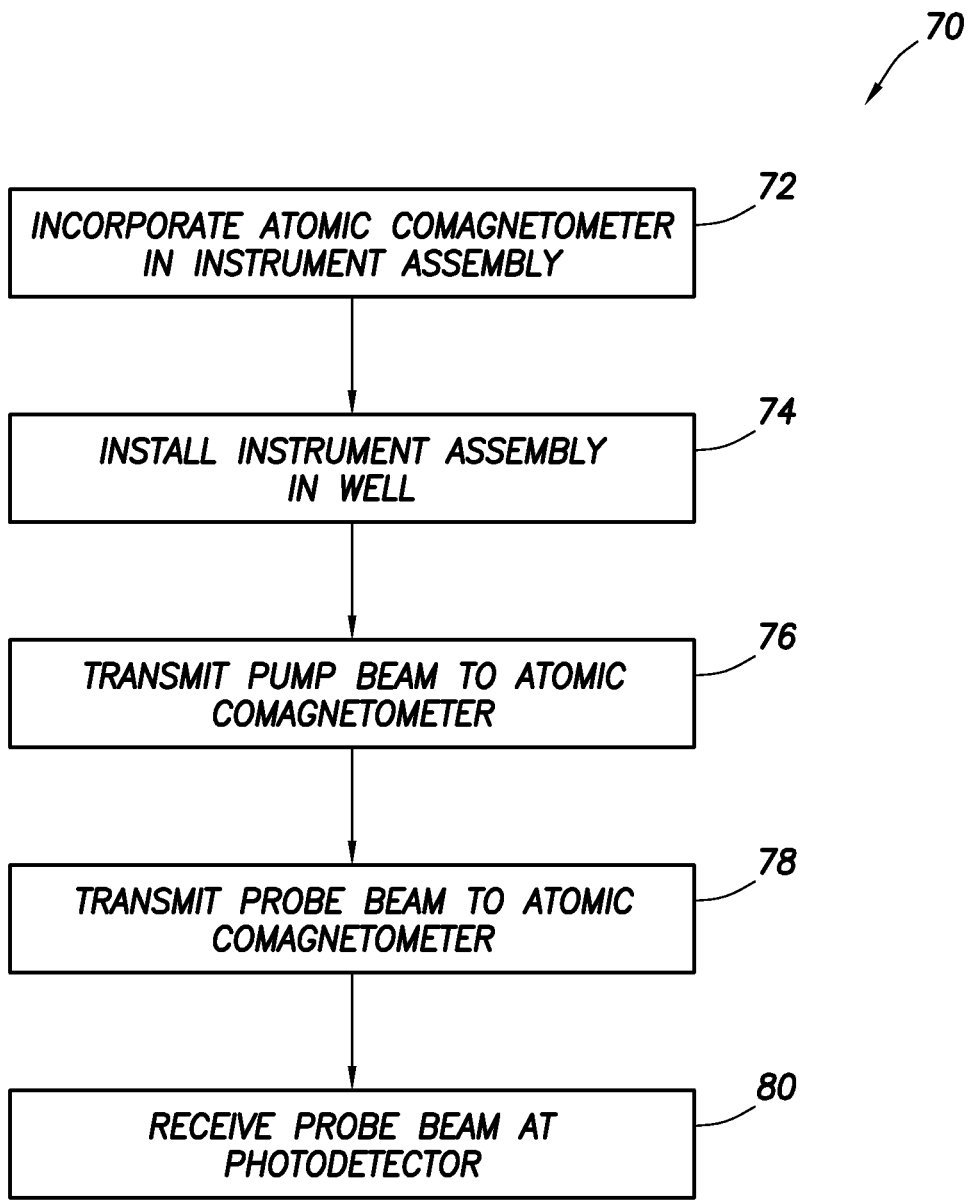
FIG. 3 is a schematic flowchart of an orientation sensing method embodying principles of this disclosure.

Referring additionally now to FIG. 3, a schematic flowchart of an orientation sensing method 70 is representatively illustrated. The method 70 may be used with the sensing system 10 described above, or the method may be used with various different sensing systems.

In an initial step 72, the atomic comagnetometer 22 is incorporated in the instrument assembly 12. As described above, the instrument assembly 12 includes at least the comagnetometer 22, and can include various other instruments, well tools, etc. In examples described below (see FIGS. 4-12), the control system 24, the photodetector 44, the pump laser 46 and/or the probe laser 48 may be included in the instrument assembly 12.

In a subsequent step 74, the instrument assembly 12 is installed in the well. This step 74 may comprise conveying the instrument assembly 12 via the cable 20, a tubular string or any other conveying means.

In a step 76, the pump beam 40 is transmitted from the pump laser 46 to the cell 32 of the comagnetometer 22. This polarizes the alkali metal electrons and, via spin-exchange, causes nuclear polarization of the noble gas in the cell 32.

In a step 78, the probe beam 42 is transmitted from the probe laser 48 and through the cell 32. The probe beam 42 is linearly polarized.

In step 80, the probe beam 42 is received at the photodetector 44. By analyzing characteristics of the received probe beam 42, the rotation of the instrument assembly 12 can be determined.

Figure 4:
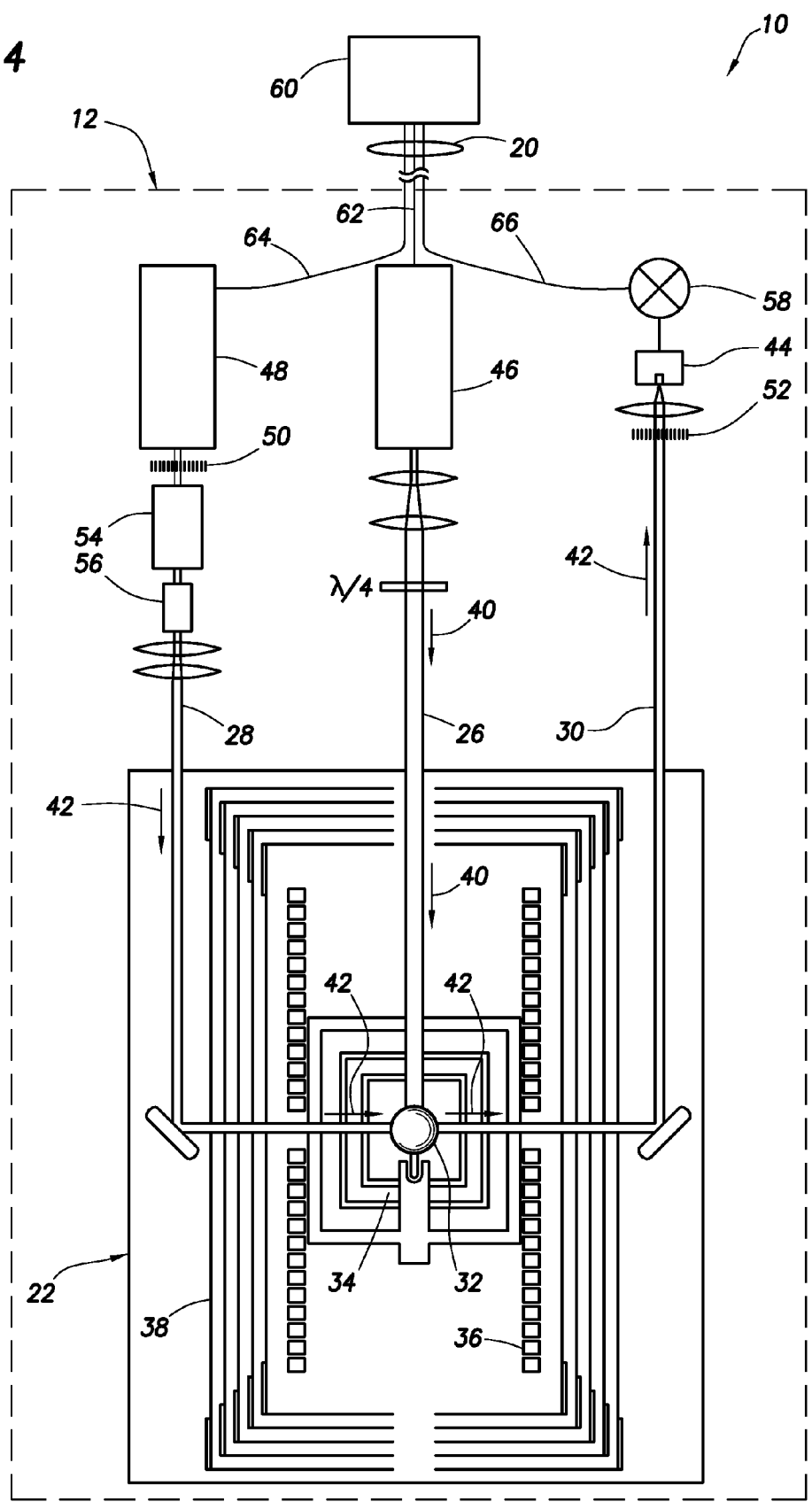
FIG. 4 is a schematic view of another configuration of the downhole orientation sensing system.

Referring additionally now to FIG. 4, another configuration of the downhole orientation sensing system 10 is representatively illustrated. In this configuration, the photodetector 44, pump laser 46 and probe laser 48 (and associated components) are included in the instrument assembly 12 for conveyance into the wellbore 14.

The electronic circuitry 60 may remain at the remote location, and the cable 20 may comprise the lines 62, 64, 66 extending between the circuitry and the pump laser 46, probe laser 48 and amplifier 58. However, in other examples, the circuitry 60 could also be included in the instrument assembly 12.

Figure 5:
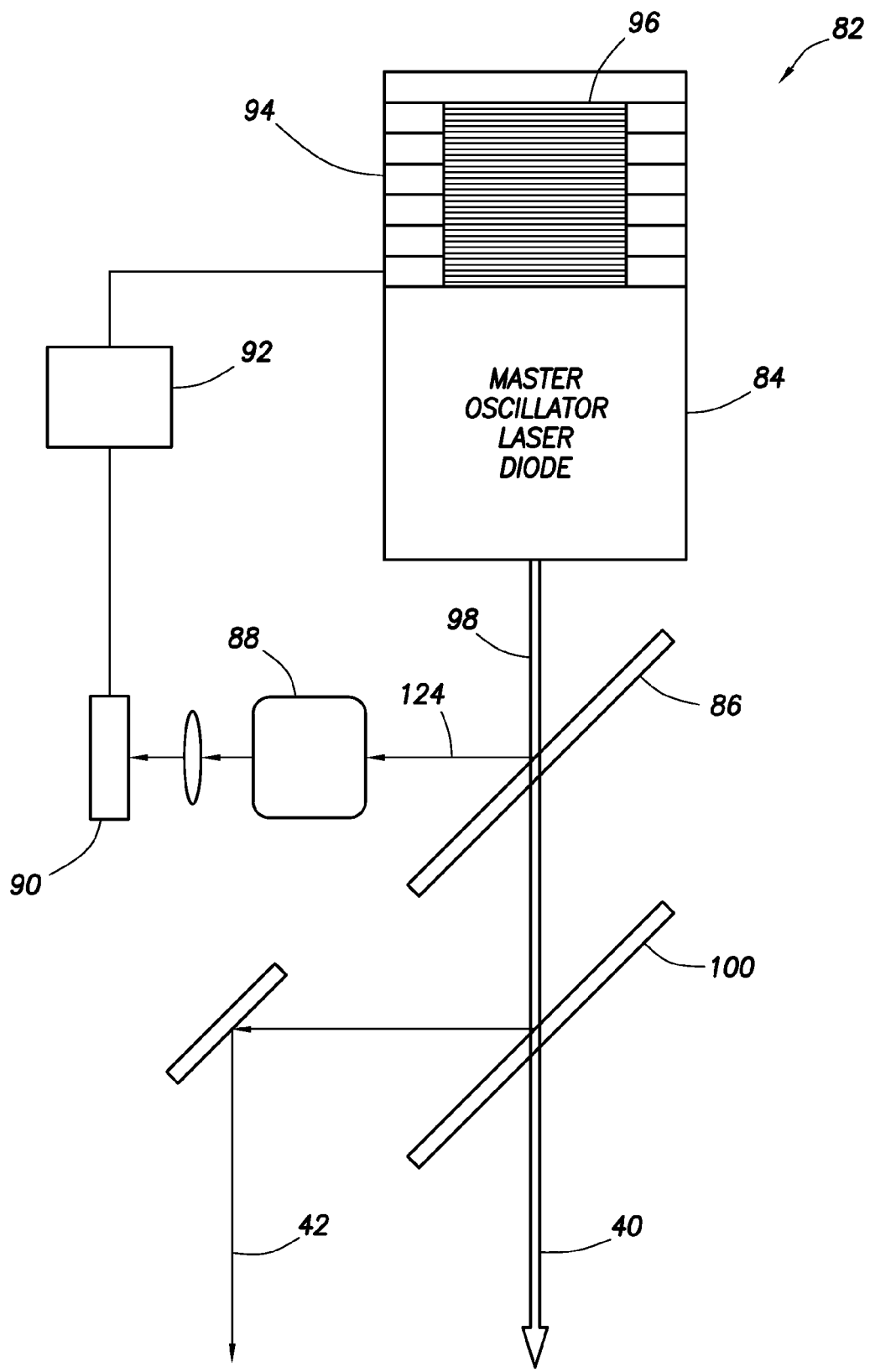
FIGS. 5-12 are schematic diagrams of various optical sources which may be used in the downhole orientation sensing system.

Referring additionally now to FIG. 5, an optical source 82 (that is, a source of light) is schematically illustrated. The optical source 82 may be used for the pump laser 46 and/or probe laser 48 in the sensing system 10.

As depicted in FIG. 5, the optical source 82 includes a master oscillator laser diode 84, a beam splitter (or fiber splitter) 86, a rubidium gas cell 88, a photodetector 90, a controller 92, a piezoelectric element stack 94 and a grating feedback cavity 96. The grating feedback cavity 96 is used to "tune" the light beam 98 output by the master oscillator laser diode 84 to a selected wavelength (such as 794.98 nm, e.g., in the case of use of a rubidium gas cell 32 in the comagnetometer 22).

The beam splitter 86 reflects a relatively small portion of the beam 98, so that it passes through the rubidium gas cell 88. If the beam's 98 wavelength is centered closely at 794.98 nm, the cell 88 will absorb most of the light, and so relatively little light will remain to impinge on the photodetector 90. An increase in the light detected by the photodetector 90 will indicate that the beam 98 is not centered at the desired 794.98 nm wavelength.

The controller 92 receives the output of the photodetector 90 and adjusts an electric potential applied to the piezoelectric element stack 94, as needed, in order to maintain the beam 98 wavelength centered at the desired wavelength. For example, the controller 92 may dither back and forth, looking for a minimum output of the photodetector 90, which indicates that the beam 98 is centered at the desired wavelength.

The electric potential applied to the piezoelectric element stack 94 acts to lengthen the grating feedback cavity 96, which thereby adjusts the wavelength of light reflected back into a lasing cavity of the master oscillator laser diode 84.

The cell 88 may in one example be the same as the cell 32 in the comagnetometer 22 (i.e., the cells 32, 88 are actually the same cell). In that case, the beam 98 portion reflected from the beam splitter 86 through the cell 32/88 could be directed orthogonal to the pump beam 40 and probe beam 42.

The beam 98 may serve as the pump beam 40 and/or the probe beam 42 in the comagnetometer 22. For example, another beam splitter 100 may be used to reflect a portion of the beam 98 to be used as the probe beam 42, with the remaining beam which passes through the beam splitter being used as the pump beam 40. Such an arrangement (use of one optical source to provide both pump and probe beams 40, 42)

may be used in any of the configurations described herein, or an optical source may be used for only the pump beam or only the probe beam, as desired.

Figure 6:
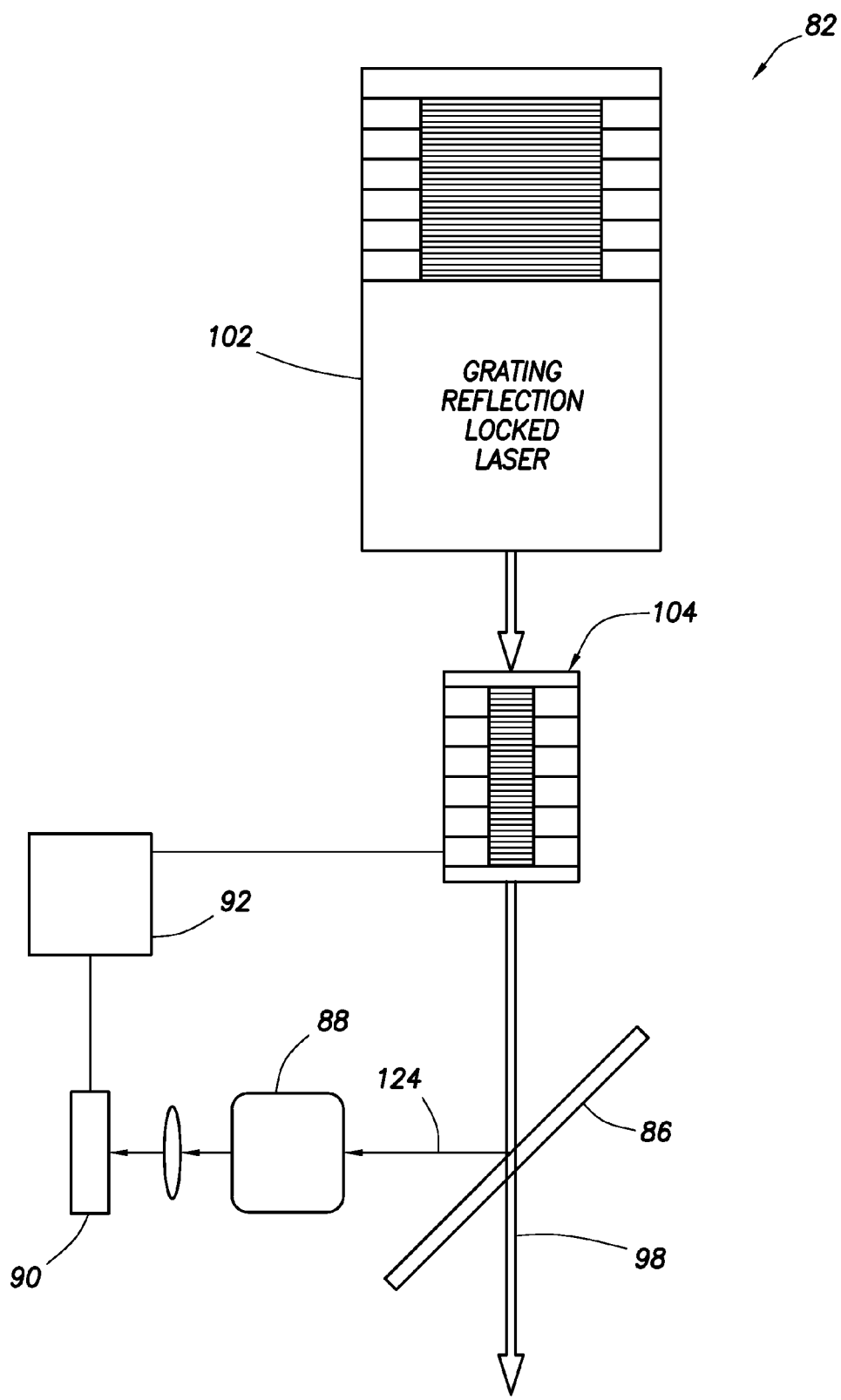

Referring additionally now to FIG. 6, another configuration of the optical source 82 is representatively illustrated. In this configuration, the optical source 82 includes a grating reflection locked laser 102, with the beam 98 output by the laser being directed through an external tunable grating stabilizer 104.

Somewhat similar to the piezoelement stack 94 and grating feedback cavity 96 described above, the stabilizer 104 is used to "tune" the output of the laser 102 by reflecting light at a chosen wavelength back into the laser cavity. Operation is similar to that described above for the configuration of FIG. 5, in that the controller 92 adjusts the electric potential applied to the stabilizer 104, as needed to maintain a minimized output of the photodetector 90.

Referring additionally now to FIGS. 7-12, several different configurations of the optical source 82 are representatively illustrated. These optical source 82 configurations may be used in any of the sensing system 10 examples described herein.

Figure 7:
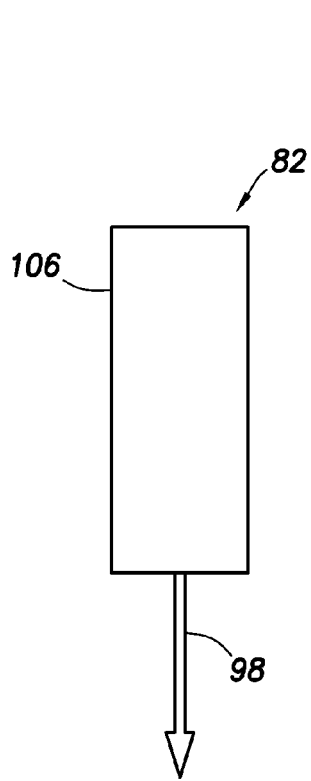

In FIG. 7, the optical source 82 comprises a rubidium gas laser 106. The laser 106 may include rubidium gas and a buffer gas in a lasing cavity of the laser. The rubidium gas may be radio frequency pumped, electrode discharge pumped, diode laser pumped, etc.

Preferably, the rubidium gas is diode laser pumped, and helium or hydrogen is used as the buffer gas. However, other types of rubidium gas laser may be used in keeping with the principles of this disclosure.

Figure 8:
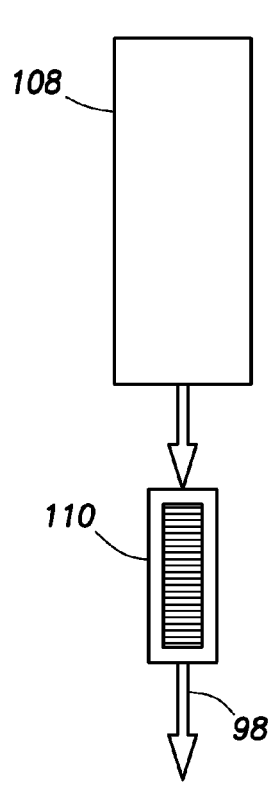

In FIG. 8, the optical source 82 comprises a laser diode 108. Any type of laser diode 108 may be used (for example, distributed feedback laser, distributed Bragg reflector, Fabry-Perot, etc.).

As depicted in FIG. 8, an external laser stabilizer grating 110 may be used to stabilize the output beam 98 at the desired wavelength. A suitable stabilizer grating is manufactured by Broptics Technology Inc. of Taipei, Republic of China (website www.broptics.com).

Figure 9:
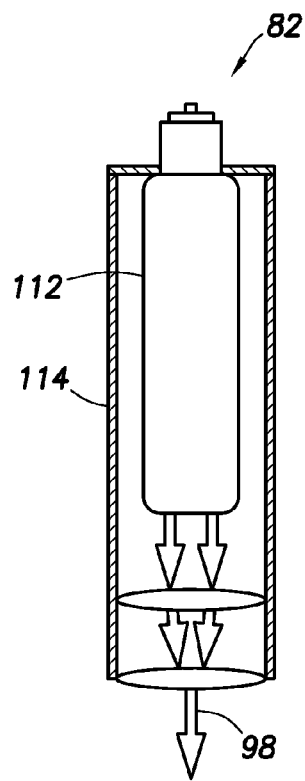

In FIG. 9, the optical source 82 comprises a lamp 112, such as a rubidium vapor lamp. The vapor may be radio frequency pumped or electrode discharge pumped. A suitable rubidium vapor lamp is available from Osram GmbH of Berlin, Germany.

A free space condenser lens/collimator projector 114 may be used to collect and focus the lamp 112 output to form the beam 98. A filter (not shown) may be used to block unwanted wavelengths.

A fiber intensifier (not shown) may be used to increase the efficiency of the beam 98 generation. A polarizer (not shown) may be used before or after the filter, or before or after the fiber intensifier.

Figure 10:
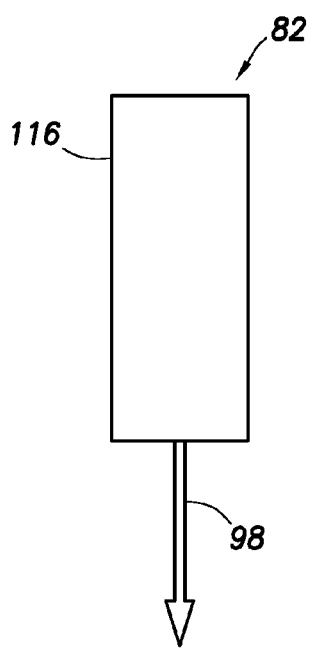

In FIG. 10, the optical source 82 comprises one or more light emitting diode (LED) 116. For multiple LED's 116, a multimode fiber combiner (not shown) may be used to combine the outputs of the individual LED's to form the beam 98. As with the configuration of FIG. 9, a filter, fiber intensifier and/or polarizer may be used to obtain desired characteristics of the beam 98.

Figure 11:
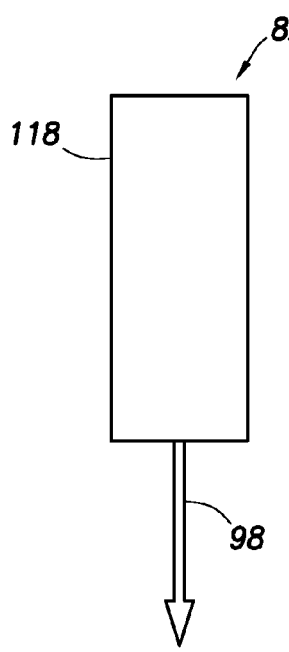

In FIG. 11, the optical source 82 comprises one or more superluminescent diode (SLD) 118. For multiple SLD's 118, a multimode fiber combiner (not shown) may be used to combine the outputs of the individual LED's to form the beam 98. As with the configuration of FIGS. 9 & 10, a filter, fiber intensifier and/or polarizer may be used to obtain desired characteristics of the beam 98.

Figure 12:
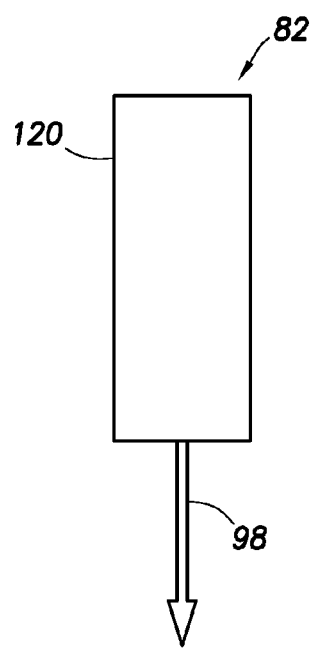

In FIG. 12, the optical source 82 comprises a fiber laser 120. The fiber laser 120 may be athermallized (temperature compensated), for example, as described in International publication no. WO 01/67142.

For any of the above described configurations of the optical source 82, it is preferable to be able to "tune" the beam 98 wavelength to a desired wavelength downhole. It is expected that drift due to temperature increases downhole will be a primary concern, but the use of a cooling device in the instrument assembly 12 could alleviate, or at least significantly reduce, any thermally-induced wavelength drift.

For pumping and probing a rubidium gas cell 32 in the comagnetometer 22, it is preferred that wavelengths of 794.98 nm and 795.28 nm be used. The probe beam 42 can be generated from the pump beam 40 by modulating at 142.46 GHz to produce a 0.3 nm offset.

Another approach to obtaining light sources at 794.98 nm and 795.28 nm is to start with a source at 795.13 nm and mix it with a source at 71.23 GHz. Jimenez, Juan J., et al., "Recent Progress in Laser Frequency Synthesis," Infrared Physics, vol. 17, pp. 541-546, (Pergamon Press, pub. 1977) provides details as to how frequencies can be synthesized using a microwave source, lasers and a Josephson junction point contact diode. However, it should be clearly understood that any wavelengths and any techniques for obtaining those wavelengths may be used in keeping with the principles of this disclosure.

It may now be fully appreciated that the sensing system 10 and method 70 provide advancements to the art of orientation sensing in a subterranean well. Examples described above provide for accurate downhole orientation sensing, whether optical sources 82 are positioned downhole or at the earth's surface.

The above disclosure provides to the art a method 70 of sensing orientation of an instrument assembly 12 in a subterranean well. The method 70 can include incorporating an atomic comagnetometer 22 and an optical source 82 into the instrument assembly 12, and installing the instrument assembly 12 in the well.

The method 70 can include the optical source 82 generating a pump beam 40 in the downhole instrument assembly 12, whereby the pump beam 40 is transmitted from the optical source 82 to the atomic comagnetometer 22. The generating step can also include the optical source 82 generating a probe beam 42 in the downhole instrument assembly 12. The generating step can also include separating the probe beam 42 from the pump beam 40.

The method 70 may include the steps of splitting a beam 98 generated by the optical source 82, and transmitting a portion 124 of the beam 98 through a gas cell 32 of the atomic comagnetometer 22 along three orthogonal axes.

The method 70 may include the step of adjusting an output wavelength of the optical source 82 while the instrument assembly 12 is positioned downhole. The adjusting step can include adjusting the output wavelength in response to an output of a photodetector 90 which measures transmission of the light through a gas cell 32 or 88.

The gas cell 32 or 88 may comprise rubidium therein. The gas cell 32 is included in the atomic comagnetometer 22.

The optical source 82 may comprise a rubidium gas discharge laser 106. The rubidium gas discharge laser 106 may be laser diode pumped.

The rubidium gas discharge laser 106 may comprise rubidium and a buffer gas. The buffer gas may comprise at least one of hydrogen and helium.

The optical source 82 may comprise a laser diode 84, 108.

The optical source 82 may comprise a lamp 112. The lamp 112 may comprise a rubidium vapor lamp.

The optical source 82 may comprise a light emitting diode 116, or a superluminescent light emitting diode 118.

The optical source 82 may comprises a fiber laser 120. The fiber laser 120 is preferably athermallized.

Also provided to the art by the above disclosure is a downhole orientation sensing system 10 for use in conjunction with a subterranean well. The sensing system 10 can include a downhole instrument assembly 12 positioned in the well. The instrument assembly 12 may include an atomic comagnetometer 22 and an optical source 82 which transmits light to the atomic comagnetometer 22.

The optical source 82 may generate a pump beam 40 in the downhole instrument assembly 12, with the pump beam 40 being transmitted from the optical source 82 to the atomic comagnetometer 22.

The optical source 82 may also generate a probe beam 42 in the downhole instrument assembly 12. The probe beam 42 may be separated from the pump beam 40 by a splitter 100.

A beam 98 generated by the optical source 82 can be split and transmitted through a gas cell 32 of the atomic comagnetometer 22 along three orthogonal axes.

The optical source 82 may comprise a controller 92 which adjusts an output wavelength of the optical source 82 downhole. The controller 92 may adjust the output wavelength in response to an output of a photodetector 90 which measures transmission of the light through a gas cell 88.

The optical source 82 may comprise a controller 92 which adjusts a wavelength of light generated by the optical source 82, depending on absorption of light by a gas cell 88. The gas cell 88 may be included in the atomic comagnetometer 22 (e.g., being the same as the gas cell 32). The controller 92 may vary a potential applied to a piezoelectric element 94, thereby adjusting a length of a feedback cavity 96, in response to a level of the absorption of light by the gas cell 88.

The instrument assembly 12 may comprise at least one of a lock-in amplifier 58, a Faraday modulator 54 and a Pockel cell 56.

Light having different wavelengths may be mixed, which produces pump and probe beams 40, 42 transmitted to the atomic comagnetometer 22.

It is to be understood that the various examples described above may be utilized in various orientations, such as inclined, inverted, horizontal, vertical, etc., and in various configurations, without departing from the principles of the present disclosure. The embodiments illustrated in the drawings are depicted and described merely as examples of useful applications of the principles of the disclosure, which are not limited to any specific details of these embodiments.

In the above description of the representative examples of the disclosure, directional terms, such as "above," "below," "upper," "lower," etc., are used for convenience in referring to the accompanying drawings. In general, "above," "upper," "upward" and similar terms refer to a direction toward the earth's surface along a wellbore, and "below," "lower," "downward" and similar terms refer to a direction away from the earth's surface along the wellbore.

Of course, a person skilled in the art would, upon a careful consideration of the above description of representative embodiments, readily appreciate that many modifications, additions, substitutions, deletions, and other changes may be made to these specific embodiments, and such changes are within the scope of the principles of the present disclosure. Accordingly, the foregoing detailed description is to be clearly understood as being given by way of illustration and example only, the spirit and scope of the present invention being limited solely by the appended claims and their equivalents.

What is claimed is:

1. A method of sensing orientation of an instrument assembly in a subterranean well, the method comprising:
   incorporating an atomic comagnetometer and an optical source into the instrument assembly; and
   installing the instrument assembly in the well.

2. The method of claim 1, further comprising the optical source generating a pump beam in the downhole instrument assembly, whereby the pump beam is transmitted from the optical source to the atomic comagnetometer.

3. The method of claim 2, wherein the generating step further comprises the optical source generating a probe beam in the downhole instrument assembly.

4. The method of claim 3, wherein the generating step further comprises separating the probe beam from the pump beam.

5. The method of claim 1, further comprising the steps of splitting a beam generated by the optical source, and transmitting a portion of the beam through a gas cell of the atomic comagnetometer along three orthogonal axes.

6. The method of claim 1, further comprising the step of adjusting an output wavelength of the optical source while the instrument assembly is positioned downhole.

7. The method of claim 6, wherein the adjusting step further comprises adjusting the output wavelength in response to an output of a photodetector which measures transmission of the light through a gas cell.

8. The method of claim 7, wherein the gas cell comprises rubidium therein.

9. The method of claim 7, wherein the gas cell is included in the atomic comagnetometer.

10. The method of claim 1, wherein the optical source comprises a rubidium gas discharge laser.

11. The method of claim 10, wherein the rubidium gas discharge laser is laser diode pumped.

12. The method of claim 10, wherein the rubidium gas discharge laser comprises rubidium and a buffer gas.

13. The method of claim 12, wherein the buffer gas comprises at least one of hydrogen and helium.

14. The method of claim 1, wherein the optical source comprises a laser diode.

15. The method of claim 1, wherein the optical source comprises a lamp.

16. The method of claim 15, wherein the lamp comprises a rubidium vapor lamp.

17. The method of claim 1, wherein the optical source comprises a light emitting diode.

18. The method of claim 1, wherein the optical source comprises a superluminescent light emitting diode.

19. The method of claim 1, wherein the optical source comprises a fiber laser.

20. The method of claim 19, wherein the fiber laser is athermallized.

21. The method of claim 1, wherein the optical source comprises a controller which adjusts a wavelength of light generated by the optical source, depending on absorption of light by a gas cell.

22. The method of claim 21, wherein the gas cell is included in the atomic comagnetometer.

23. The method of claim 21, wherein the controller varies a potential applied to a piezoelectric element, thereby adjusting a length of a feedback cavity, in response to a level of the absorption of light by the gas cell.

24. The method of claim 1, wherein the instrument assembly comprises at least one of a lock-in amplifier, a Faraday modulator and a Pockel cell.

25. The method of claim 1, further comprising the step of mixing light having different wavelengths, thereby producing pump and probe beams transmitted to the atomic comagnetometer.

26. A downhole orientation sensing system for use in conjunction with a subterranean well, the sensing system comprising:

a downhole instrument assembly positioned in the well, the instrument assembly including an atomic comagnetometer and an optical source which transmits light to the atomic comagnetometer.

27. The sensing system of claim 26, wherein the optical source generates a pump beam in the downhole instrument assembly, the pump beam being transmitted from the optical source to the atomic comagnetometer.

28. The sensing system of claim 27, wherein the optical source also generates a probe beam in the downhole instrument assembly.

29. The sensing system of claim 28, wherein the probe beam is separated from the pump beam by a splitter.

30. The sensing system of claim 26, wherein a beam generated by the optical source is split and is transmitted through a gas cell of the atomic comagnetometer along three orthogonal axes.

31. The sensing system of claim 26, wherein the optical source comprises a controller which adjusts an output wavelength of the optical source downhole.

32. The sensing system of claim 31, wherein the controller adjusts the output wavelength in response to an output of a photodetector which measures transmission of the light through a gas cell.

33. The sensing system of claim 32, wherein the gas cell comprises rubidium therein.

34. The sensing system of claim 32, wherein the gas cell is included in the atomic comagnetometer.

35. The sensing system of claim 26, wherein the optical source comprises a rubidium gas discharge laser.

36. The sensing system of claim 35, wherein the rubidium gas discharge laser is laser diode pumped.

37. The sensing system of claim 35, wherein the rubidium gas discharge laser comprises rubidium and a buffer gas.

38. The sensing system of claim 37, wherein the buffer gas comprises at least one of hydrogen and helium.

39. The sensing system of claim 26, wherein the optical source comprises a laser diode.

40. The sensing system of claim 26, wherein the optical source comprises a lamp.

41. The sensing system of claim 40, wherein the lamp comprises a rubidium vapor lamp.

42. The sensing system of claim 26, wherein the optical source comprises a light emitting diode.

43. The sensing system of claim 26, wherein the optical source comprises a superluminescent light emitting diode.

44. The sensing system of claim 26, wherein the optical source comprises a fiber laser.

45. The sensing system of claim 44, wherein the fiber laser is athermallized.

46. The sensing system of claim 26, wherein the optical source comprises a controller which adjusts a wavelength of light generated by the optical source, depending on absorption of light by a gas cell.

47. The sensing system of claim 46, wherein the gas cell is included in the atomic comagnetometer.

48. The sensing system of claim 46, wherein the controller varies a potential applied to a piezoelectric element, thereby adjusting a length of a feedback cavity, in response to a level of the absorption of light by the gas cell.

49. The sensing system of claim 26, wherein the instrument assembly comprises at least one of a lock-in amplifier, a Faraday modulator and a Pockel cell.

50. The sensing system of claim 26, wherein light having different wavelengths is mixed, which produces pump and probe beams transmitted to the atomic comagnetometer.

* * * * *